United States Patent [19]

Bower

[11] Patent Number: 4,918,445
[45] Date of Patent: Apr. 17, 1990

[54] SCANNING, ROW-COLUMN TYPE KEYBOARD

[75] Inventor: Grant L. Bower, Seattle, Wash.

[73] Assignee: Hewlett-Packard Company, Palo Alto, Calif.

[21] Appl. No.: 221,856

[22] Filed: Jul. 20, 1988

[51] Int. Cl.$^4$ ........................................... H03M 11/00
[52] U.S. Cl. .................................... 341/26; 340/825.79
[58] Field of Search .................... 341/22, 23, 24, 25, 341/26, 33; 178/17 C; 340/711, 712, 825.79, 825.83, 825.85, 825.87; 400/477, 479, 479.1; 364/189; 361/351, 352, 397, 398, 400, 416; 84/1.01, 1.11, 1.12–1.14, 1.19

[56] References Cited

U.S. PATENT DOCUMENTS

| | | | |
|---|---|---|---|
| 4,148,017 | 4/1979 | Tomisawa | 341/26 |
| 4,554,530 | 11/1985 | Mussmann | 341/26 |
| 4,581,603 | 4/1986 | Ingold et al. | 341/24 |

OTHER PUBLICATIONS

"Using a One-Chip Microprocessor for TV Tuning & Remote Control" by E. Dreiske, IEEE Tras. on Consumer Elec., Feb. 1978.

Primary Examiner—Donald J. Yusko
Assistant Examiner—Tyrone Queen

[57] ABSTRACT

A keyboard and keyboard system for use in an electronic device having a plurality of keys. A matrix of keys in rows and columns with each key being defined by an intersection of a row and column wire is used. Either the rows or columns function as initial inputs and the other of the rows or columns function as an initial driver. After a key press, the initial input is changed to a secondary driver and all initial drivers are changed to secondary inputs. The secondary inputs are then read to detect which key has been pressed and the row and the column are connected at the appropriate intersection representing the key which has been pressed. The keyboard system decodes each intersection to define the representation of each key and the representation is communicated to the associated electronic device. A method for detecting input from a keyboard is also disclosed.

4 Claims, 4 Drawing Sheets

SCANNING, ROW-COLUMN TYPE KEYBOARD

BACKGROUND OF THE INVENTION (A) Field of the Invention

The present invention relates generally to a keyboard for an electronic device which uses a row-column type structure to detect a key input and in particular to such a keyboard which detects a key input without continuous scanning of the rows or columns.

(B) Background Art

Traditionally, keyboards for various electronic devices with many key inputs use a row-column type structure consisting of a matrix of keys wherein each key is defined as the intersection of a row and column wire. A switch is used at each such intersection to short the rows and columns. The column wires are set to either high or low one at a time with the columns always connected to drivers, and the rows are then used as inputs to see if any of the intersections are shorted in that column.

This type of keyboard has an advantage in minimizing hardware when there are a large number of keys to be used in the design. However, problems have occurred in the prior art in that the continuous nature of the scanning and the long wires required in the row-column structure can lead to RFI (radio frequency interference) transmission from the keyboard. Any such continuous pattern can be detected by an eavesdropper and/or may fail to pass governmental agency RFI tests, thus requiring special shielding over the keyboard or other measures to reduce RFI transmission. One solution to this RFI transmission from the keyboard is to enclose the keyboard in metal. Plastic enclosures are, however, much less expensive and lighter weight to use so that what is desired is the reduction of RFI transmission by internal means so that a metal enclosure is not required.

One prior art attempt to solve the problem maintains all drivers (columns) energized and waits for any input. When there is an input as a key is pressed one scan cycle is completed. A problem occurs in this situation in that with one scan cycle there is still radiated energy back into the electronic device. For example, if the electronic device is a test instrument and the device has not been protected against radio frequency energy the RFI from the one scan cycle can distort a measurement and yield an incorrect result. Further, eavesdropping is still possible on one scan cycle because of the RFI transmitted.

Another prior art approach called "clock dithering" requires that the frequency or time between successive energizings of the drivers (columns) be modulated. In this way, the amplitude of the energy is not centered at one frequency but instead spread over a broader frequency range at a lower amplitude. The problem with this approach is that it is difficult to accomplish and it only reduces but does not eliminate the problem.

U.S. Pat. No. 3,902,054 to Cochran et al., discloses a calculator system having a keyboard with an array of keys in rows and columns. The columns are continuously strobed in sequence by cycle times of the calculator system.

U.S. Pat. No. 4,502,038 to Lowenthol et al., discloses a method and apparatus for continuously scanning a keyboard which allows the simultaneous depression of a multiple number of keys on a keyboard.

SUMMARY OF THE INVENTION

In order to overcome problems and difficulties inherent in the prior art, there has been provided by the subject invention a novel keyboard system which uses a matrix of keys in rows and columns as in the prior art. The columns initially function as drivers and the rows initially function as inputs. However, in the present invention, instead of continuously scanning for an input which emits continuous and high RFI, the microprocessor associated with the present invention looks for low voltage in a row to indicate a key press. When there is a key press, the initial input is changed to a secondary driver and the initial drivers are changed to secondary inputs. The secondary inputs are then read to detect which key has been pressed. In this way, the rows and columns are switched only once when a key is pressed and released thus avoiding continuous scanning of the keyboard and excess RFI energy emitted by the circuit.

It is therefore an object and advantage of the present keyboard to provide a keyboard with greatly reduced RFI emissions in order to pass certain governmental agency RFI tests.

It is another object and advantage of the present keyboard to provide a keyboard with greatly reduced RFI emissions in order to deter potential eavesdroppers from interfering with a continuous transmission.

Yet another object and advantage of the present invention is to provide a keyboard system with greatly reduced RFI emissions thereby requiring greatly reduced hardware restrictions.

Still yet another object and advantage of the present invention is to provide a keyboard system with greatly reduced RFI emissions thereby requiring less expensive and lighter weight complementary electronic equipment.

DESCRIPTION OF THE PREFERRED EMBODIMENT

Figure 1:
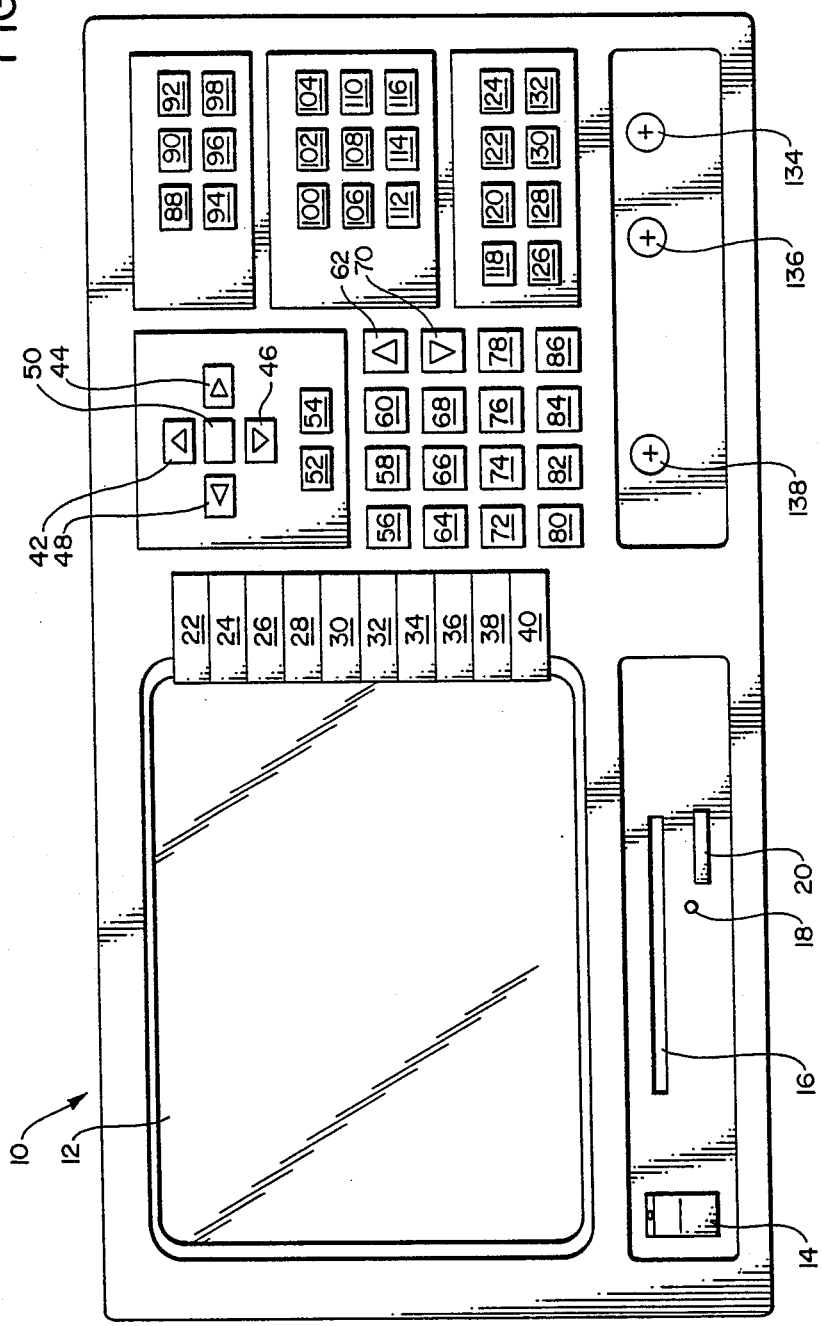
FIG. 1 is a plan view of a front panel of an illustrative electronic device in which the present keyboard system is used.

Referring now to the drawings in general, the present keyboard system functions as described hereinafter. The keyboard comprises a matrix of keys in rows and columns with each key being defined by an intersection of a row and a column. The matrix of rows and columns initially remains quiescent until there is a key press. Initially, the rows function as inputs and the columns function as drivers. Pull up resistors initially function to force the row values to a logic one level. When a key is pressed, a column driver is connected to the input of one row. The logic level from the column driver changes the normal logic level one for that row to a logic level zero. When a logic zero is detected in any row, the columns are all turned into inputs and the particular row that showed a zero input is changed to a driver. The columns which are now functioning as inputs are read to detect which intersection of a row and column is connected and hence which key has been pressed. The present keyboard system decodes each intersection to define the representation of each key and the representation is communicated to the associated electronic device.

Referring now to FIG. 1 of the drawings there is shown a front plan view of the front panel of the particular electronic device in which the present keyboard system is used. The present keyboard system may be used in any device which requires a keyboard but is most particularly suited to equipment with a large number of keys where high RFI transmissions can cause problems. The example device shown in FIG. 1 is a network spectrum analyzer with a frequency range from zero to 102.4 kilohertz so that RFI transmissions from the keyboard in this range being performed would interfere with the measurement of test equipment. In FIG. 1 the front panel of the HP35660A Dynamic Signal Analyzer is shown generally by the numeral 10. Positioned on the Dynamic Signal Analyzer 10 is the CRT screen or display 12 for displaying various data which has been analyzed. Positioned below the display 12 is the power switch 14, the disk drive opening 16, a light 18 which indicates when the disk drive is in use and an eject button 20 for removing the disk when it is no longer being used. Adjacent to the display 12 are "soft keys" which operate as function keys 22, 24, 26, 28, 30, 32, 34, 36, 38, and 40 wherein the functions performed by these keys may be changed. To the right of the function keys are marker keys 42, 44, 46, 48, 50, 52, and 54 which operate to move a cursor on the display and below the marker keys are a variety of entry keys 56, 58, 60, 62, 64, 66, 68, 70, 72, 74, 76, 78, 80, 82, 84, and 86. To the right of the marker keys are display keys 88, 90, 92, 94, 96 and 98 for various display functions on the CRT screen 12 and below the display keys are measurement keys 100, 102, 104, 106, 108, 110, 112, 114, and 116 for performing various measurements of electronic output. Below the measurement keys are system keys 118, 120, 122, 124, 126, 128, 130, and 132 for performing various system functions. Next to the disk drive opening 16 are analog input and output indicators 134, 136, and 138. It is to be understood that the Dynamic Signal Analyzer has been used by way of illustration only and the present invention may be used in any electronic device with a keyboard.

Figure 2:
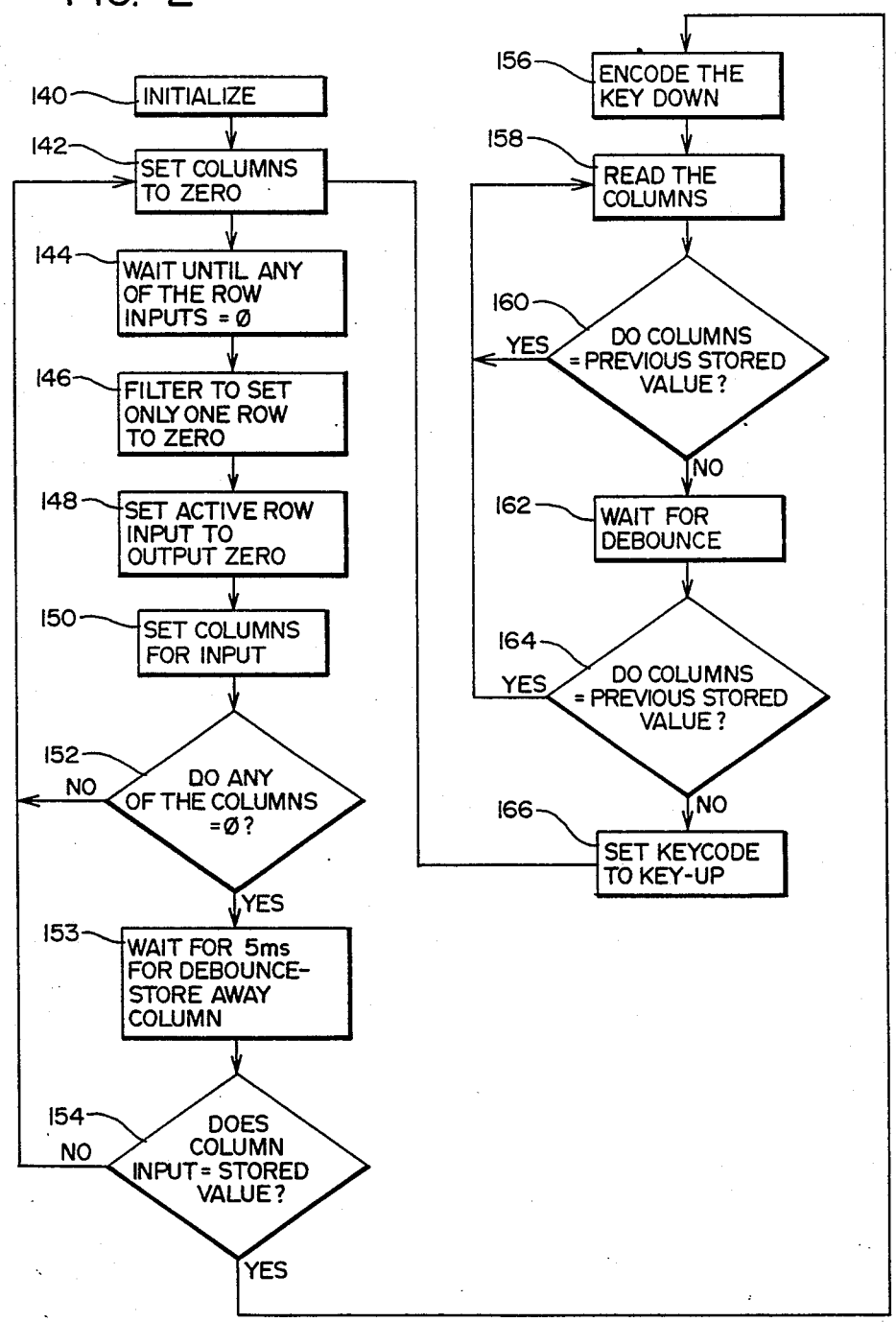
FIG. 2 is a flow diagram of the steps taken in detecting a key input on the present keyboard.

Referring now to FIG. 2 of the drawings there is shown a flow diagram of the steps taken in detecting a key press on the keyboard. In the preferred embodiment of the present invention a Signetics 8441 microprocessor is used to control the keyboard system. However, the invention is not to be limited to that particular microprocessor as a number of microprocessors such as an Intel 8048 may also be used. The microprocessor is shown generally by the numeral 167. At step 140 the rows and columns of the keyboard matrix are initialized. The initialization process includes setting up housekeeping of the microprocessor and internal buffers to predetermined, known states. The next step 142 sets all columns in the matrix to zero. Then at step 144 software associated with the keyboard waits until any of the row inputs of the matrix equal zero. A row input equal to zero indicates that a key has been depressed as will be explained in greater detail with reference to FIGS. 3 and 4. When there is detected a row input equal to zero indicating that a key is depressed, then continuation to step 146 is completed wherein there is a filtering to set only one row to zero which provides for the unlikely situation in which two keys are pressed simultaneously. Were this to occur, the software would choose one key and filter out the input from the other key. The keyboard can, however, implement 2-key rollover, which is the pressing down of a first key which is held down and then a second key is pressed so that two keys are being held down at the same time. This is accomplished by the software associated with the keyboard system looking for the second key after the first key is released. At the next step 148 the active row input from step 146 is set to output zero and then at step 150 the columns are set for input. At the following step 152 the software checks if any of the columns equals zero and if not there is a return to step 142 wherein the columns are again set to zero. If any of the columns at step 152 equals zero then there is a five millisecond wait for debounce at step 153. Mechanical switches when switched will initially bounce (connect and disconnect). Debounce is the process of waiting until this bounce has completed before accepting a reading so the software associated with the keyboard system provides a wait so that the mechanical constraints imposed on the system by a key press can be accommodated. Then, at step 154 there is a check to see if the column input equals the stored value as received from step 152. If the values of the column input and the stored value are not equal there is a return to step 142 again setting the column values to zero. If the column input and the stored value are equal, then at step 156 the key down is encoded and there is a progression to step 158 where the columns are read, and at step 160 the column values are checked to see if any of the column values equals the previously stored value. If any of the column values equals the previously stored value there is a return to step 158 where the columns are read. If none of the column values equals the previously stored value there is a wait for debounce at step 162 and at step 164 the column values are again checked to see if any equals the previously stored value. If any of the column values equals the previously stored value at step 164 there is a return to step 158 where the columns are read. If none of the column values equals the previously stored value there is a progression to step 166 where the key code is set to key up and microprocessor control is returned to step 142 where all the columns are set to zero.

Figure 3:
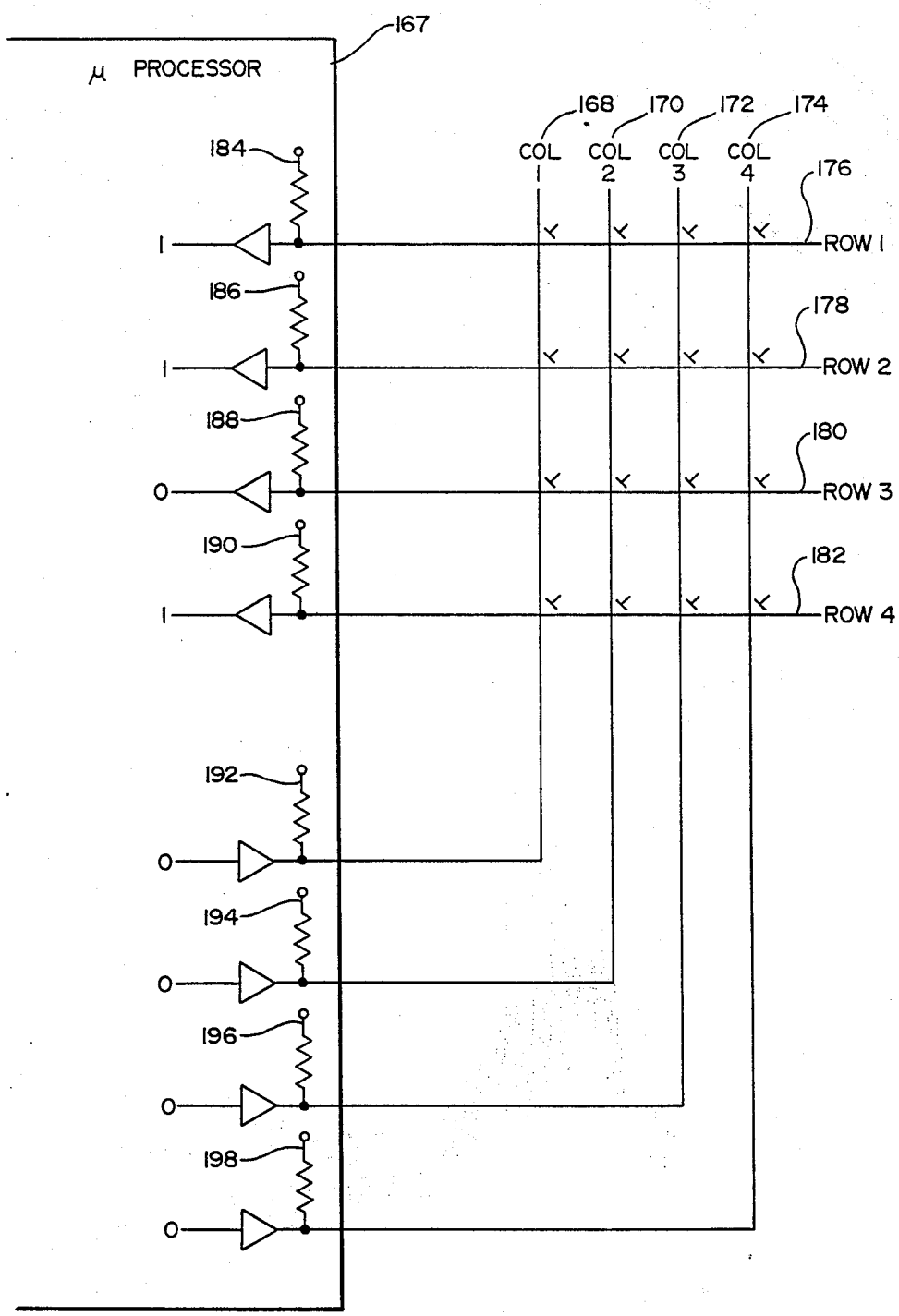
FIG. 3 is a schematic view of the present keyboard system after a key press and determining a row address.
Figure 4:
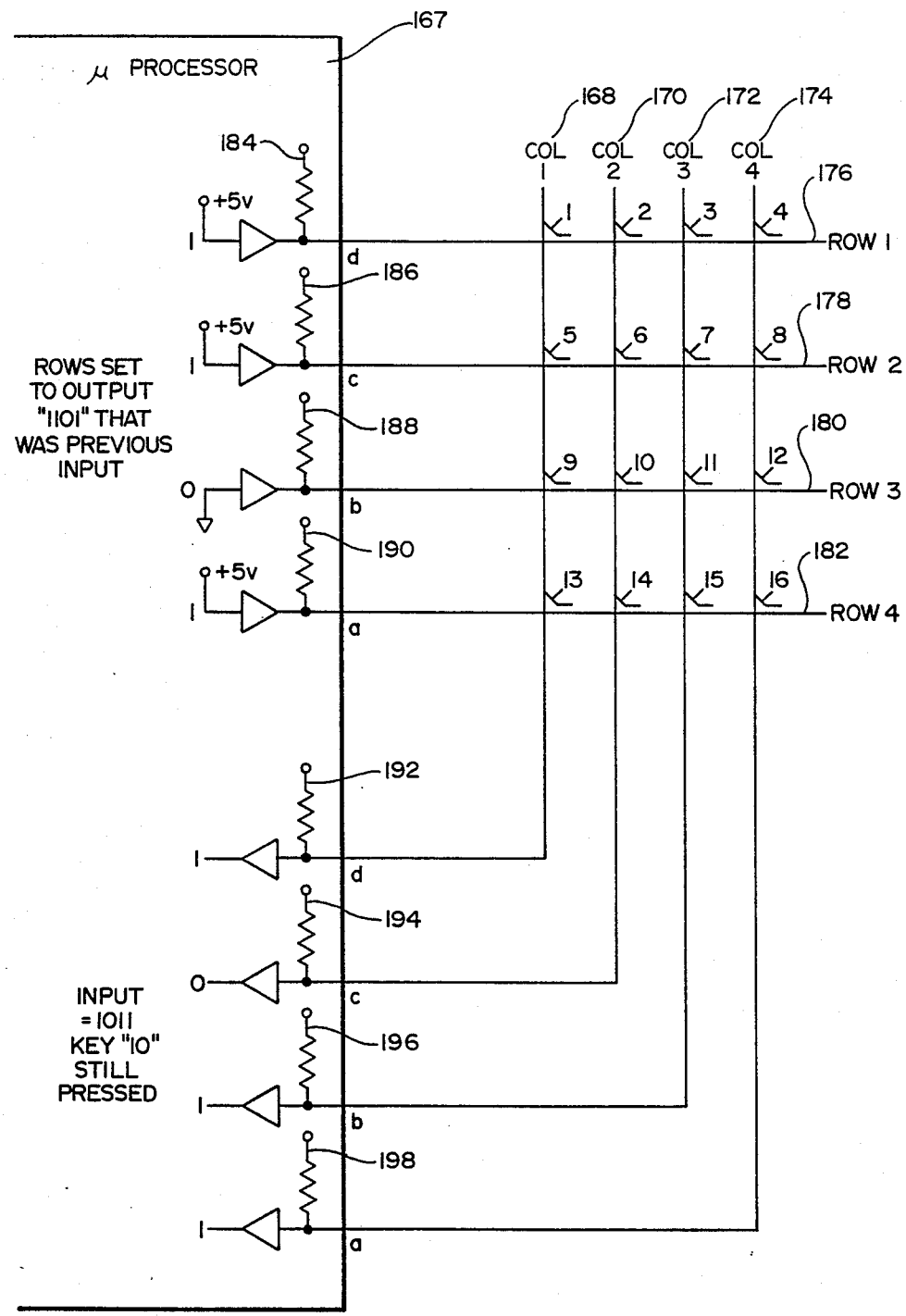
FIG. 4 is a schematic view of the present keyboard system determining a column address.

Referring now to FIGS. 3 and 4 of the drawings there are shown schematic views of the present keyboard system. As indicated with regard to FIG. 2, a Signetics 8441 microprocessor is used to control the present keyboard system, however the system is not limited to use of that particular microprocessor. In the example of FIG. 3 the columns 168, 170, 172, and 174 are originally set to logic low (zero) and function as drivers. In the preferred embodiment of the present invention, the columns 168, 170, 172, and 174 initially function as drivers. However, it is to be understood that the invention is not to be limited in this way as the rows 176, 178, 180, and 182 could also initially function as drivers within the spirit and scope of the invention. In the preferred embodiment, the rows are used as inputs to detect when any key in the matrix is pressed. In FIG. 3 it can be seen that initially the columns 168, 170, 172, and 174 are driven by a logic zero and the rows 176, 178, 180, and 182 are read. If no key is pressed, the pull up resistors 184, 186, 188, and 190 will force the row values to a logic one level. When a key is pressed, a column driver is connected to the input of one row. In the preferred embodiment, there is thereby connected positive voltage to ground causing a logic level zero. The microprocessor of the present invention looks for a low voltage to indicate that a key has been pressed. Next, as shown in FIG. 4, the logic level zero from the column driver changes the normal logic level one for that row to a logic level zero. This indicates first that a key has been pressed and secondly, it gives the row address of the key. The column address of the key is still needed to identify which key has been pressed. In the example of FIG. 4, row 3 at number 180 is the only row with a logic zero level, thus the 10 key that was pressed has a row address of 3. Next, as shown in FIG. 4, the rows 176, 178, 180, and 182 are driven with the logic levels of the previous row value read and the columns 168, 170, 172, and 174 function as input and are read. Again, the pull up resistors 184, 186, 188, 190, 192, 194, 196, and 198 on the columns will normally force the column values to a logic level one. With the key pressed as shown in FIG. 4, the row driver 3 is connected to the column input 2. The logic level zero from the row 3 output brings the column 2 value to a logic zero level. The columns 168, 170, 172, and 174 are then read to detect which intersection is connected. The logic level zero read in column 2 gives the column address. When combined with the previously obtained row address, the column address defines which key has been pressed. If more than one row inputs a zero on the initial read, only one of the rows 170 is set to zero on the second read. The logic levels of the present invention are implemented in TTL. However, it should be understood that this implementation could occur in a number of logic level families such as CMOS. In order to change the columns or rows from a driver to input a pseudo open collector system is utilized. This system is modeled like a tri state buffer connected to the input of a regular buffer. The microprocessor then controls whether the tri state buffer or the input is active.

It should be understood in the present invention that, in a manner contrary to the prior art, the present keyboard system does not have either the rows or columns activated to wait for a key press. Rather, in the present invention both the rows and columns remain quiescent until there is a key press. When there is no key press there is no oscillating or switched signal on either the row or column lines, there is only steady state voltages of a logic level zero or one. The only time that a switch signal occurs is when a key is pressed and initial inputs or initial drivers switch to secondary inputs or secondary drivers. When a key press is detected by a logic level zero in any row, the columns are turned from drivers into inputs and the row that showed an input indicating a key press is changed to a driver. In this way, the rows and columns are connected only when a key is pressed and released. There is therefore no scanning of columns or drivers but only a one time change of polarity of the columns accomplished with the pull up resistors when a row indicates an input through a key press. This one time change in polarity is virtually undetectable by any electronic devices.

From the foregoing, it can be seen that the present invention provides a keyboard system with greatly reduced RFI emissions thereby protecting transmissions from potential eavesdroppers. The present keyboard system with greatly reduced RFI emissions also requires greatly reduced hardware restrictions and less expensive and lighter weight complimentary electronics equipment while still complying with certain governmental agency RFI emissions standards. It should also be apparent from a review of the drawings and from a study of the specifications presented herein and the claims appended thereto that changes may be made in the applicant's device such as rearrangement of parts, changes in structure and other changes all of which would be considered to be within the spirit and scope of the invention. The applicant is not to be limited to the exact embodiment shown which has been given by way of illustration.

Having described my invention, I claim:

1. A method of detecting key operations in a matrix keyboard, the keyboard having a plurality of keys each operable to connect one of a set of first wires with one of a set of second wires, each key being uniquely identified by the particular first and second wires which it serves to connect, the method comprising first and second operations performed sequentially:

the first operation including:
driving each of the first wires with a first logic signal; and
sensing the presence of a first logic signal on one of the second wires, said sensing indicating that a key has been operated, and serving to identify the particular second wire to which the operated key is connected;

the second operation including:
driving the second wire on which the first logic signal was sensed with a second logic signal; and
sensing the presence of a second logic signal on one of the first wires, said sensing of a second logic signal serving to identify the particular first wire to which the operated key is connected.

2. The method of claim 1 in which the first operation includes driving column wires and sensing row wires, and the second operation includes driving a row wire and sensing column wires.

3. The method of claim 1 in which the first and second logic signals are both logic zero signals.

4. The method of claim 3 in which the first operation includes driving column wires and sensing row wires, and the second operation includes driving a row wire and sensing column wires.

* * * * *

UNITED STATES PATENT AND TRADEMARK OFFICE
CERTIFICATE OF CORRECTION

PATENT NO. : 4,918,445
DATED : April 17, 1990
INVENTOR(S) : Grant L. Bower

It is certified that error appears in the above-identified patent and that said Letters Patent is hereby corrected as shown below:

Title page [54], "SCANNING, ROW-COLUMN TYPE KEYBOARD"

should be --NON SCANNING, ROW-COLUMN TYPE KEYBOARD--.

Signed and Sealed this

Twenty-first Day of September, 1993

Attest:

BRUCE LEHMAN

Attesting Officer     Commissioner of Patents and Trademarks